(12) United States Patent
Omori

(10) Patent No.: US 6,294,960 B1
(45) Date of Patent: Sep. 25, 2001

(54) PHASE LOCK LOOP CIRCUIT USING SIGNAL ESTIMATOR

(75) Inventor: Youko Omori, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/454,403

(22) Filed: Dec. 3, 1999

(30) Foreign Application Priority Data

Dec. 4, 1998 (JP) .................................................. 10-345773

(51) Int. Cl.[7] ....................................................... H03L 7/08
(52) U.S. Cl. ................................ 331/14; 331/25; 455/296
(58) Field of Search .......................... 331/14, 25; 455/296

(56) References Cited

U.S. PATENT DOCUMENTS 3,806,815 * 4/1974 Fletcher et al. ....................... 375/332
4,232,957 * 11/1980 Tracey et al. ......................... 375/327

FOREIGN PATENT DOCUMENTS 10-327204 * 12/1998 (JP) .
12-69102 * 3/2000 (JP) .

* cited by examiner

Primary Examiner—Siegfried H. Grimm
(74) Attorney, Agent, or Firm—Ostrolenk, Faber, Gerb & Soffen, LLP

(57) ABSTRACT

A signal estimator estimates a transmission signal series using Viterbi algorithm, and outputs an estimated signal and a minimum path metric signal. A switching unit is controlled by a control signal in such a manner that, for a certain period from the start of the operation of PLL which requires quick response, a minimum path metric history signal is selected, while, in the other case, an estimated signal is selected. A replica generator generates a replica signal using a signal output from the switching unit. The generation of the replica signal using the path metric history signal offers quick response, but on the other hand, the accuracy is low. On the other hand, the use of the estimated signal offers high accuracy, but on the other hand, the response speed is low. Thus, a phase change contained in a received signal is corrected in a highly accurate and quick manner.

12 Claims, 8 Drawing Sheets

INPUT SIGNAL FROM COUNTER-109

PHASE LOCK LOOP CIRCUIT USING SIGNAL ESTIMATOR

FIELD OF THE INVENTION

The invention relates to a phase lock loop circuit which, in communication systems for digital transmission, detects and corrects a phase shift, in a received signal, attributable, for example, to a phase variation created in frequency offset or signal rise in burst transmission, and more particularly to a phase lock loop circuit using a signal estimator, which can accurately detect and correct a phase shift even in the case of a received signal which has been remarkably deteriorated by transmission path distortion.

BACKGROUND OF THE INVENTION

In communication systems for digital transmission, a signal received by a receiver often contains a phase attributable, for example, to a phase variation created in frequency offset or signal rise in burst transmission. A phase lock loop circuit is provided on the receiver side in order to detect and correct the phase shift contained in the received signal.

Further, for communication systems for digital transmission, the received signal is influenced by distortion created in the transmission path. Therefore, in order to restore the received signal which has been deteriorated by the transmission path distortion, an equalizer or a signal estimator is provided on the receiver side.

To this end, a phase lock loop circuit using a signal estimator is provided on the receiver side in communication systems for digital transmission to remove the transmission path distortion and, at the same time, to correct the phase shift.

The construction of a conventional phase lock loop circuit using a signal estimator described in Japanese Patent Application No. 135454/1997 will be described with reference to FIG. 1 (block diagram).

This conventional phase lock loop circuit using a signal estimator comprises a phase rotator 102, a delay element 120, a signal estimator 303, a replica generator 112, a phase detector 113, a filter 114, and VCO (a voltage controlled oscillator) 115.

The phase rotator 102 rotates the phase of a received signal 117 input through an input terminal 101 based on a signal generated by VCO 115 to correct the phase shift contained in the received signal 117.

The signal estimator 303 estimates a transmission signal series from the distorted received signal by a Viterbi algorithm, and outputs an estimated signal 116.

The replica generator 112 performs a convolution operation of a previously determined transmission path impulse response value and the estimated signal 116 estimated by the signal estimator 303 to generate a replica signal 118 of the received signal 117 which is then output.

The phase detector 113 detects the phase difference between the replica signal 118 generated in the replica generator 112 and a signal output from the delay element 120. In this case, when the received signal 117 involves a frequency offset, the phase between the transmitted signal and the received signal changes with the elapse of time. This leads to a change in phase difference detected by the phase detector 113 with the elapse of time.

In the replica generator 112, the transmission path impulse response value used in the convolution operation is constant. Therefore, the replica signal 118 is output which does not suffer from phase variation so far as any error does not occur in the signal estimator 303. Since, however, the output signal of the delay element 120 suffers from a phase change, this phase difference is output from the phase detector 113.

The delay element 120 outputs the signal output from the phase rotator 102 by the quantity of delay equal to that created in the signal estimator 303. This permits the timing of the replica signal 118 output from the replica generator 112 to be synchronized with the timing of the signal output from the delay element 120.

The filter 114 filters the phase difference detected by the phase detector 113, and then outputs the bandwidth-limited VCO 115.

VCO 115 outputs a signal, of which the frequency is controlled by the signal output from the filter 114, to the phase rotator 102.

In this case, the phase detector 113, the filter 114, VCO 115, the phase rotator 102 operates as feedback loop means.

Next, the operation of this conventional phase lock loop circuit using an signal estimator will be explained.

The phase of the phase shift-containing received signal 117 input through the input terminal 101 is rotated by the phase rotator 102, and the signal is then input into the delay element 120 and the signal estimator 303. At the beginning of the operation of the phase lock loop circuit, a signal output from the phase rotator 102 contains a phase shift.

In the signal estimator 303, a transmission signal series is estimated from the phase-rotated received signal using Viterbi algorithm, and the signal estimator 303 outputs the estimate signal 116. The delay element 120 delays the signal output from the phase rotator 102 by the quantity of delay equal to that created in the signal estimator 303, and then outputs the delayed signal.

The phase detector 113 detects the phase difference between the replica signal 118 generated in the replica generator 112 and the signal output from the delay element 120. The phase difference detected by the phase detector 113 is bandwidth limited by the filter 114, and then input, as information on phase difference to be corrected, into VCO 115. The signal output from VCO 115 is input into the phase rotator 102, where the phase of the received signal 117 is rotated to correct the phase shift contained in the received signal 117.

In this conventional phase lock loop circuit using a signal estimator, control is performed toward a reduction in phase difference detected by the phase detector 113. Thus, the phase shift attributable, for example, to frequency offset contained in the received signal 117 is absorbed.

In this conventional phase lock loop circuit using a signal estimator, a phase error signal in the phase lock loop operation is generated from the series signal estimated in the signal estimator 303 using the replica signal 118. Therefore, phase lock correcting operation can be done with high accuracy even in the case of a received signal having large transmission path distortion.

In deciding the estimated signal in the conventional Viterbi algorithm, the so-called "traceback" is carried out wherein a decision is made in such a manner that the smallest path is selected among path metric values and traceback is then performed by a certain number from this path (for example, by 10 symbols) to determine the status of the path. The estimated signal 116 is output as a result of the decision.

In the conventional phase lock loop circuit using a signal estimator shown in FIG. 1, due to the constriction thereof, establishment of the estimated value by the series estimation in the signal estimator 303 causes some time delay. When the phase change rate is small, operation is performed without any problem even though the delay derived from the signal estimation in the signal estimator 303 is large. On the other hand, when the phase change rate has become large at the time of initial pulling or the like, the phase follow-up of the phase lock loop cannot catch up with the phase change, leading to divergence.

One method for increasing the phase follow-up speed of the phase lock loop is such that the frequency band of the filter 114 shown in FIG. 1 is broadened to increase the response speed of the phase lock loop. Broadening the frequency band of the filter 114, however, is likely to be influenced by disturbance such as noise. This deteriorates the follow-up accuracy of the phase shift.

Another method for increasing the phase follow-up speed of the phase lock loop is to decrease the estimation delay time of the signal estimator 303, thereby increasing the response speed. Decreasing the delay of the signal estimator 303, however, decreases the estimation ability of the signal estimator 303. Therefore, the estimated signal series contains many errors, making it impossible to correctly generate the replica signal 118. This in turn deteriorates the quality of information on the phase difference determined by the phase detector 113.

In this case, as with broadening of the frequency band of the filter 114, the follow-up of the phase lock loop is disturbed by the influence of noise or distortion contained in the received signal 117, making it impossible to correctly follow up the phase.

A further method for increasing the phase follow-up speed of the phase lock loop is described in Japanese Patent Application No. 238625/1998. In this method, a replica signal is generated using information on the minimum path metric in the signal estimator.

The construction of the conventional phase lock loop circuit using a signal estimator is shown in FIG. 2.

The conventional phase lock loop circuit shown in FIG. 2 is different from the conventional phase lock loop circuit shown in FIG. 1 in that the signal estimator 303 has been replaced with a signal estimator 103, the delay element 120 has been replaced with a delay element 106 and, instead of the estimated signal 116, a minimum path metric history signal 105 generated in the signal estimator 103 is input into the replica generator 112.

The construction of the signal estimator 103 is the same as that of the signal estimator 303, except that the function of outputting a minimum path metric history signal 105 has been newly added.

The minimum path metric history signal 105 is the result of the temporary estimation of the signal from the current path status without traceback in the decision of the estimated signal 116 in the conventional Viterbi algorithm. Since the minimum path metric history signal 105 is output without traceback, the delay time elapsed until the minimum path metric history signal 105 is output after the input of the signal into the signal estimator 103 is short.

For this reason, according to the conventional phase lock loop circuit shown in FIG. 2, the generation of the replica signal 118 using the minimum path metric history signal 105 can shorten the delay time of the whole phase lock loop circuit and can increase the response speed.

The delay time of the delay element 106 is a time corresponding to the time delay elapsed until, after the input of the received signal output from the phase rotator 102 into the signal estimator 103, the minimum path metric history signal 105 is generated in the signal estimator 103 followed by reproduction of the received signal using the minimum path metric history signal 105 in the replica generator 112.

According to the conventional phase lock loop circuit using a signal estimator which generates the replica signal 118 using the minimum path metric history signal 105, the delay time elapsed until the generation of the replica signal 118 can be shortened, contributing to increased response speed. Since, however, information in the course of estimation is used, the reliability of the replica signal 118 is lowered. In some transmission path status, due to error in the course of the estimation, the phase error cannot be accurately detected, resulting in divergence.

The conventional phase lock loop circuits using a signal estimator had the following problems.

(1) According to the generation of the replica signal using an estimated signal, the phase error can be detected accurately. Since, however, the response speed is so low that, when the phase change speed is high, the phase follow-up of the phase lock loop cannot catch up with the phase change, leading to divergence.

(2) According to the generation of the replica signal using a minimum path metric history signal, the response speed can be increased. However, the reliability of the replica signal is so low that the phase error cannot be detected accurately.

SUMMARY OF THE INVENTION

Accordingly, it is an object of the invention to provide a phase lock loop circuit using a signal estimator, which, in a system for carrying out signal estimation of a received signal having large transmission path distortion by means of a signal estimator using Viterbi algorithm, can correct a phase change contained in the received signal in a highly accurate and quick manner.

In order to attain the above object, according to the first feature of the invention, a phase lock loop circuit using a signal estimator, for detecting and correcting a phase shift contained in a received signal and, in addition, removing transmission path distortion, comprises:

a signal estimator for estimating a transmission signal series using a Viterbi algorithm from the received signal and outputting the transmission signal series as an estimated signal and, in addition, outputting a minimum path metric history signal obtained as a result of temporary estimation of the signal from the current path status without traceback in the Viterbi algorithm;

switching means which, when a control signal is active, selectively outputs the estimated signal, and, when the control signal is inactive, selectively outputs the minimum path metric history signal;

replica generating means for generating a replica signal using a signal selected by the switching means;

feedback loop means for detecting a phase difference contained in the received signal from the replica signal and the received signal to correct the phase difference; and control signal generating means for rendering the control signal inactive only for a predetermined certain period from the start of the operation of the feedback loop means.

According to the invention, for a certain period after the start of the operation of the feedback loop means, the minimum path metric history signal in Viterbi algorithm is used to generate the replica signal, while after the elapse of a certain period from the start of the operation of the feedback loop means, the estimated signal in Viterbi algorithm is used to generate the replica signal.

In the signal estimator, some delay occurs until the output of an estimation result signal after the input of the received signal, while the information on the minimum path metric history can be output without substantially causing any delay. On the other hand, although the estimated signal causes delay, the reliability of the signal is higher than that of the minimum path metric history signal, realizing more accurate detection of the phase error.

Therefore, use of the two different signals according to the status of the feedback loop means can offer an advantage that, for a certain period after the start of the operation of the feedback loop means, the response speed can be increased, and, in the stable state after the elapse of the certain period, the phase shift can be corrected using more reliable information on the phase error.

According to the second feature of the invention, a phase lock loop circuit using a signal estimator, for detecting and correcting a phase shift contained in a received signal and, in addition, removing transmission path distortion, comprises:

a signal estimator for estimating a transmission signal series using a Viterbi algorithm from the received signal and outputting the transmission signal series as an estimated signal and, in addition, outputting a minimum path metric history signal obtained as a result of temporary estimation of the signal from the current path status without traceback in the Viterbi algorithm;

switching means which, when a control signal is active, selectively outputs the estimated signal, and, when the control signal is inactive, selectively outputs the minimum path metric history signal;

replica generating means for generating a replica signal using a signal selected by the switching means;

feedback loop means for detecting a phase difference contained in the received signal from the replica signal and the received signal to correct the phase difference; and control signal generating means which renders the control signal inactive when the feedback loop means is in a predetermined certain period from the start of the operation of the feedback loop means or when the phase difference detected in the feedback loop means is not less than the predetermined certain value.

The phase lock loop circuit using a signal estimator according to the invention is constricted so that, also in the case where a predetermined certain period has elapsed after the start of the operation of the feedback loop means and the operation of the feedback loop means is stable, the minimum path metric history signal is used to generate the replica signal when the detected phase difference is not less than a predetermined certain value.

Therefore, the response speed and the accuracy of the phase correction can be switched according to the status of the feedback loop means, as well as to the level of the phase variation to be followed up.

BRIEF DESCRIPTION OF THE DRAWINGS

The invention will be explained in more detail in conjunction with appended drawings, wherein.

DESCRIPTION OF THE PREFERRED EMBODIMENTS (First Preferred Embodiment)

Figure 1:
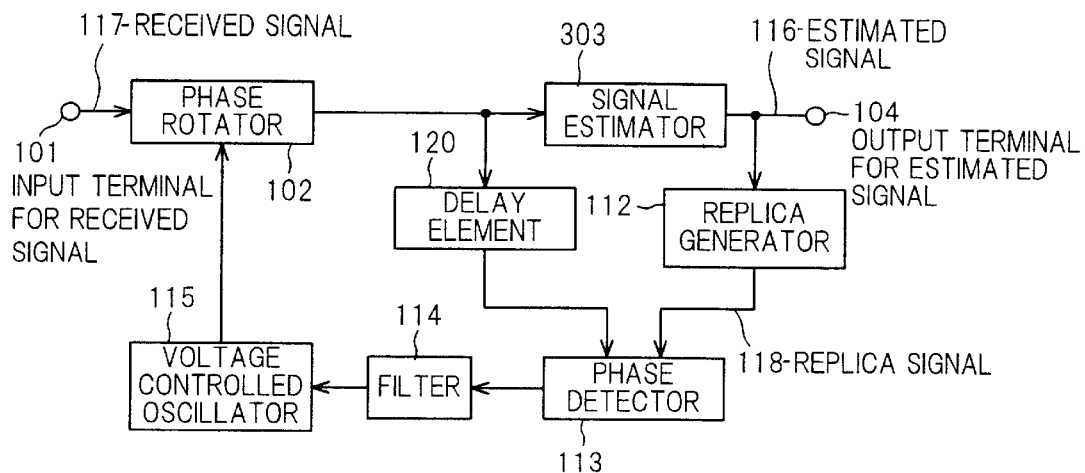
FIG. 1 is a block diagram showing the constriction of a conventional phase lock loop circuit using a signal estimator.
Figure 2:
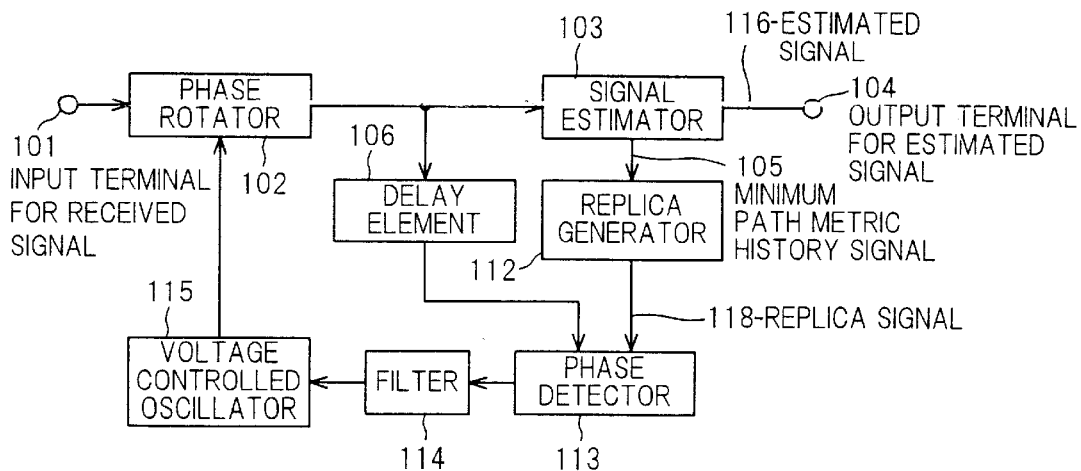
FIG. 2 is a block diagram showing the construction of another conventional phase lock loop circuit using a signal estimator.
Figure 3:
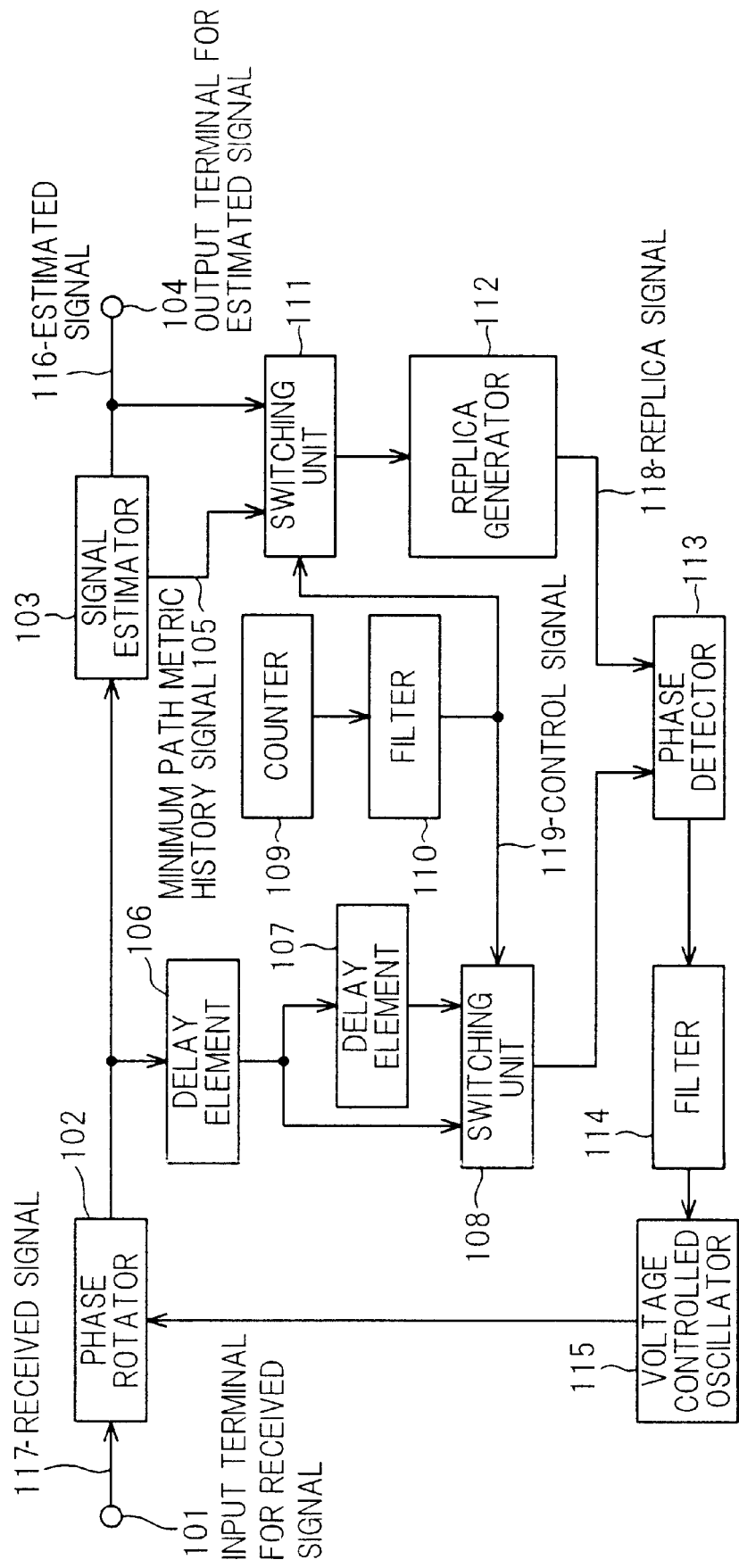
FIG. 3 is a block diagram showing the construction of a phase lock loop circuit using a signal estimator according to the first preferred embodiment of the invention.

FIG. 3 is a block diagram showing the construction of the phase lock loop circuit using a signal estimator according to the first preferred embodiment of the invention. In FIGS. 1, 2 and 3, like elements have the same reference numerals.

The phase lock loop circuit using an signal estimator according to the first preferred embodiment of the invention comprises a phase rotator 102, a signal estimator 103, delay elements 106, 107, switching units 108, 111, a counter 109, filters 110, 114, a replica generator 112, a phase detector 113, and VCO 115.

The phase lock loop circuit using a signal estimator according to this preferred embodiment is different from the conventional phase lock loop circuit using a signal estimator shown in FIG. 2 in that the switching units 108, 111, the delay element 107, the counter 109, and the filter 110 have been newly added.

The counter 109 and the filter 110 constitute control signal generating means which generates and outputs a control signal 119 for controlling the switching units 108, 111.

The switching unit 111 selects any one of the minimum path metric history signal 105 and the estimated signal 106 output from the signal estimator 103 based on the control signal 119, and then outputs the selected signal to the replica generator 112.

The delay elements 106, 107 delays the signal output from the phase rotator 102 by a time corresponding to the delay time created in the signal estimator 103 and the replica generator 112, followed by output of the delayed signal.

More specifically, the delay time in the delay element 106 is a time corresponding to the delay time elapsed until, after the input of the received signal output from the phase rotator 102 into the signal estimator 103, the signal estimator 103 generates a minimum path metric history signal 105 which is then used in the replica generator 112 to reproduce the received signal.

The delay time in the delay element 107 is a time corresponding to the time delay obtained by subtracting the delay time in the delay element 106 from the delay time elapsed until, after the input of the received signal output from the phase rotator 102 into the signal estimator 103, the estimated signal 116 is generated in the signal estimator 103 followed by reproduction of the received signal using the received signal 116 in the replica generator 112.

The switching unit 108 switches, based on the control signal 119 output from the filter 110, the delay time to be added to the signal output from the phase rotator 102. This enables the timing of the signal output form the phase rotator 102 to be synchronized with the signal output from the replica generator 112.

Figure 4:
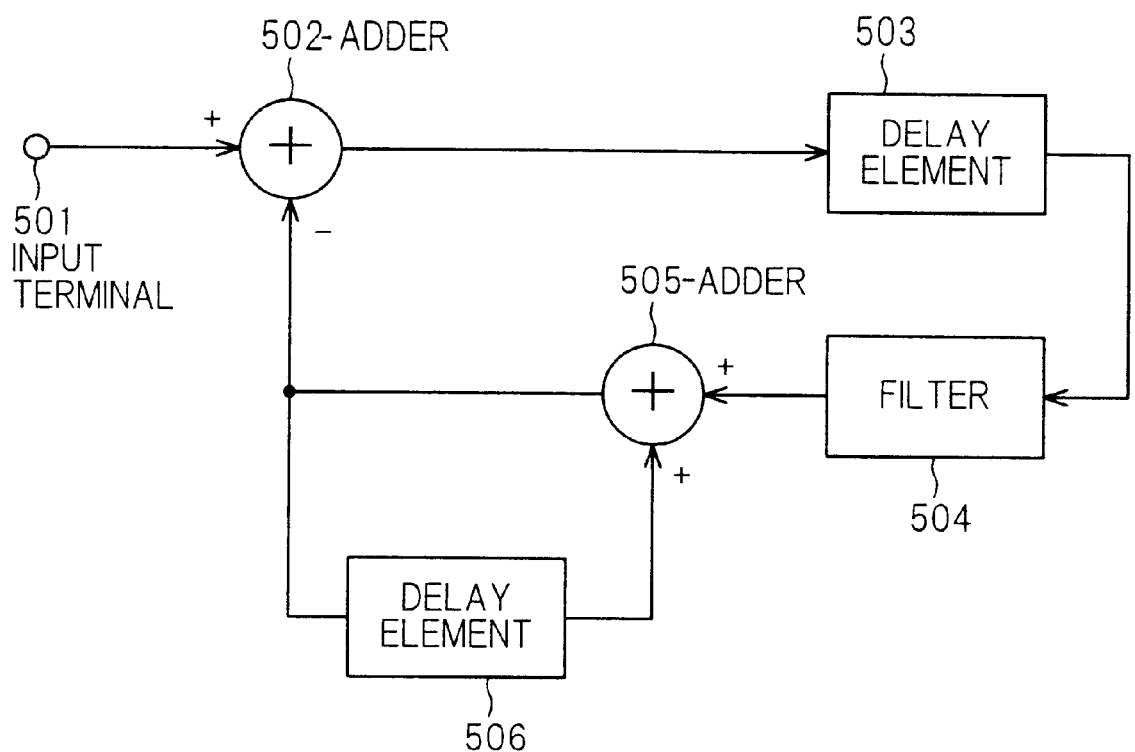
FIG. 4 is a block diagram illustrating the construction of a phase lock loop circuit using a signal estimator.

FIG. 4 is a block diagram with attention being focused on the phase shift component alone in the received signal 117 shown in FIG. 3.

The phase rotator 102 shown in FIG. 3 may be represented by an adder 502 in FIG. 4. The signal estimator 103, the delay elements 106, 107, and the replica generator 112 shown in FIG. 3 may be represented by a delay element 503 only in FIG. 4. Further, VCO 115 in FIG. 3 may be represented as an integrator comprising a delay element 506 and an adder 505 in FIG. 4.

Thus, when attention is focused on the phase shift component only, the phase lock loop circuit using a signal estimator may be interpreted as having such a construction that only the delay clement 503 has been added within the loop of the conventional PLL circuit. The phase lock loop circuit using a signal estimator according to this preferred embodiment is different from the conventional phase lock loop circuit using a signal estimator in the delay time in the delay element 503 shown in FIG. 4. According to the first preferred embodiment of the invention, the delay time can be switched. The response characteristics of the phase lock loop shown in FIG. 4 is determined by the delay time in the delay element 503 and the frequency characteristics of the filter 504. Increasing the response speed of the phase lock loop can be realized by broadening the band of the filter 114. This, however, is likely to be influenced by the disturbance of noise and the like, leading to deteriorated response accuracy. On the other hand, decreasing the delay time in the delay element 503 also can increase the response speed of the phase lock loop. In this case, decreasing the delay time does not deteriorate the response accuracy so far as the estimation in the signal estimator 103 is normally carried out. Therefore, the control of the phase correction is performed even at the time of pulling in the early stage of the operation of PLL which causes large phase variation of the received signal.

Next, the operation of the phase lock loop circuit using a signal estimator according to this preferred embodiment of the invention will be explained in more detail.

In the following explanation, it is assumed that the impulse response of transmission path distortion is spread to three symbols ($h_0$, $h_1$, $h_2$). Further, the explanation is given on the case where BPSK is used as the modulation technique. The signal estimator 103 uses MLSE (maximum likelihood sequential estimation) of three taps, and, as shown in FIG. 5, the number of branches is 8.

Figure 5:
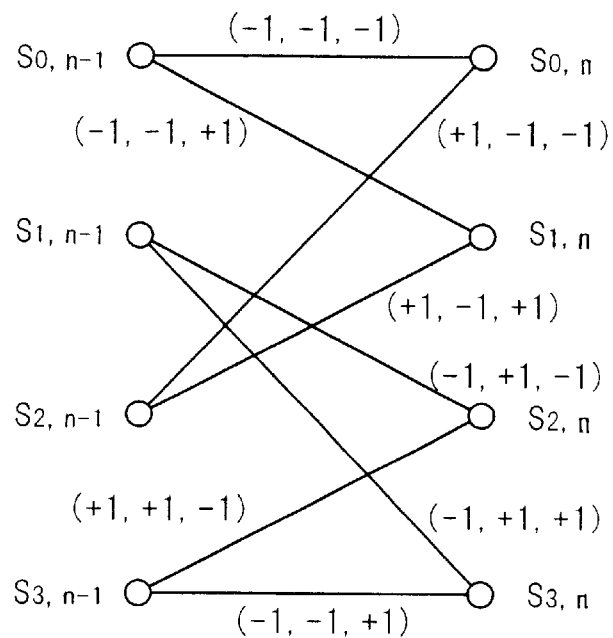
FIG. 5 is a path metric diagram of a signal estimator 103 to which Viterbi algorithm has been applied.

In the Viterbi algorithm shown in FIG. 5, 8 branch metrics are determined based on the following formulae 1 to 8.

$$b_{0,n} = |r_n - (-h_0 - h_1 - h_2)|^2 \quad (1)$$

$$b_{1,n} = |r_n - (+h_0 - h_1 - h_2)|^2 \quad (2)$$

$$b_{2,n} = |r_n - (-h_0 + h_1 - h_2)|^2 \quad (3)$$

$$b_{3,n} = |r_n - (+h_0 + h_1 - h_2)|^2 \quad (4)$$

$$b_{4,n} = |r_n - (-h_0 - h_1 + h_2)|^2 \quad (5)$$

$$b_{5,n} = |r_n - (+h_0 - h_1 + h_2)|^2 \quad (6)$$

$$b_{6,n} = |r_n - (-h_0 + h_1 + h_2)|^2 \quad (7)$$

$$b_{7,n} = |r_n - (+h_0 + h_1 + h_2)|^2 \quad (8)$$

wherein $r_n$ represents a signal received in the nth symbol.

The path metric is determined based on the following formulae 9 to 12.

$$s_{0,n} = \min [(s_{0,n-1} + b_{0,n}), (s_{2,n-1} + b_{4,n})] \quad (9)$$

$$s_{1,n} = \min [(s_{0,n-1} + b_{1,n}), (s_{2,n-1} + b_{5,n})] \quad (10)$$

$$s_{2,n} = \min [(s_{1,n-1} + b_{2,n}), (s_{3,n-1} + b_{6,n})] \quad (11)$$

$$s_{3,n} = \min [(s_{1,n-1} + b_{3,n}), (s_{3,n-1} + b_{7,n})] \quad (12)$$

The minimum path metric is determined based on the following formula 13, and a temporarily estimated value of the signal received in the nth symbol, $d_n$, is obtained.

$$s_{min,n} = \min [(s_{0,n}, s_{1,n}, s_{2,n}, s_{3,n})] \quad (13)$$

Temporarily estimated values $d_{n-1}$ and $d_{n-2}$ can be obtained by tracebacking the path leading to $d_n$ to the past. These temporarily estimated values are output as minimum path metric history signals 105. Further, tracebacking from the path having the minimum path metric value permits the estimation results in the signal estimator 103 to be sent as an estimated signal 116 to an output terminal 104.

Figure 6:
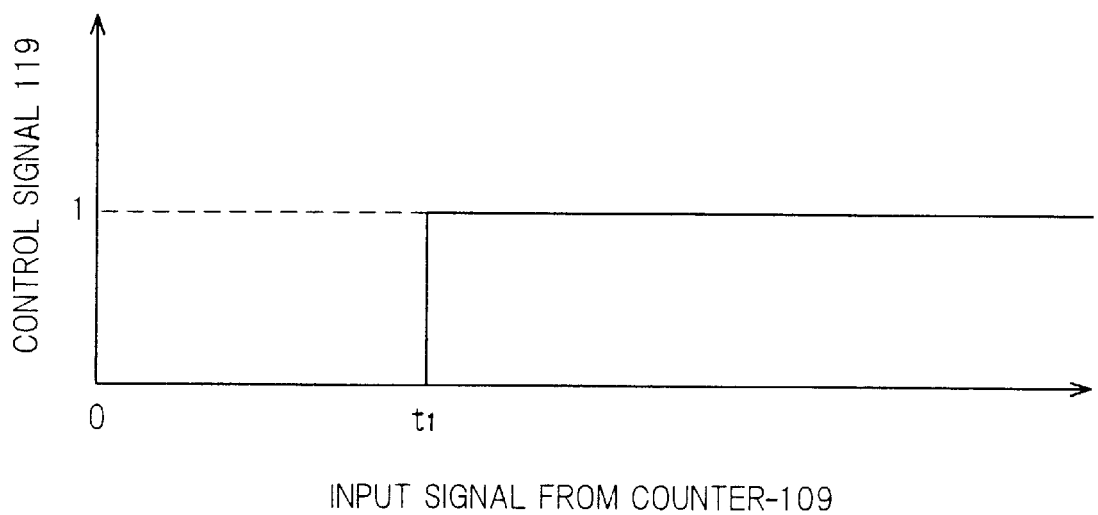
FIG. 6 is a diagram showing the characteristics of a filter 110.

According to the first preferred embodiment of the invention, the signal used in the generation of the replica signal 18 is switched at the time of convergence of PLL. The control of this switching will be explained with reference to filter characteristics shown in FIG. 6.

When PLL follows a stationary phase variation typified by frequency offset, the phase variation in the early stage of the operation of PLL is large. The phase variation, however, becomes small at the time of convergence of PLL. The time elapsed until the convergence can be calculated from the response of PLL. Here the time elapsed until the convergence of PLL is presumed to be $t_1$.

Figure 8:
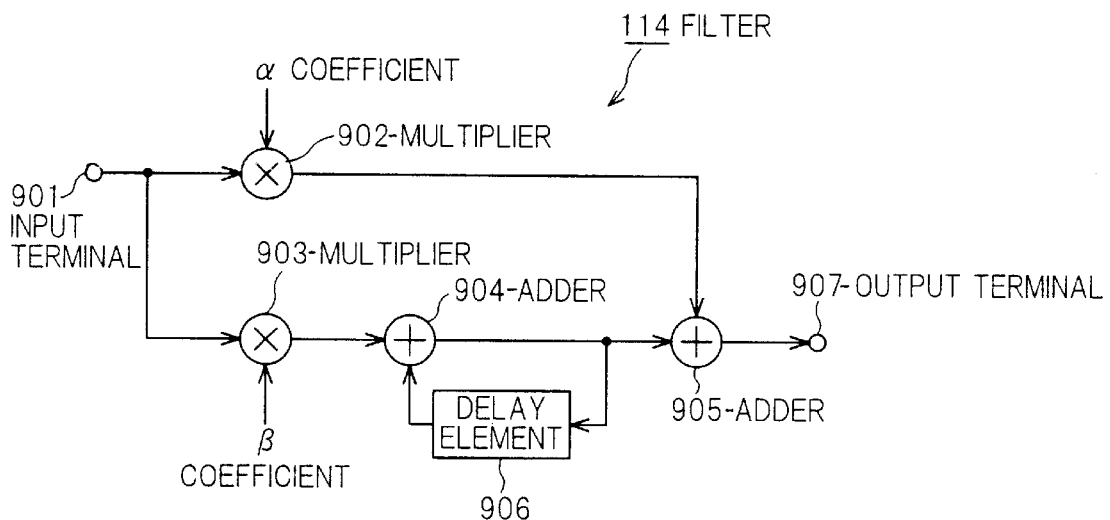
FIG. 8 is a block diagram showing the construction of a filter 114 in the phase lock loop circuit shown in FIG. 3.

The measurement of the time taken from the start of the operation of PLL by means of the counter 109 shown in FIG. 3 and the use of the filter 110 having characteristics shown in FIG. 8 permit the control signal 119 to change when the input time exceeds $t_1$, and, in this case, based on this control signal 119, the delay time and accuracy of information used in the phase detection can be switched.

Upon the receipt of the control signal 119, the switching unit 111 shown in FIG. 3 outputs the minimum path metric history signal 105 when the control signal 119 is "0," and outputs the estimated signal 116 when the control signal 119 is "1."

In the replica generator 112, the replica signal 118 is determined from signals output from the switching unit 111, $x_n$, $x_{n-1}$, $x_{n-2}$, and impulse response ($h_0$, $h_1$, $h_2$). The construction of the replica generator 112 is shown in FIG. 7.

Figure 7:
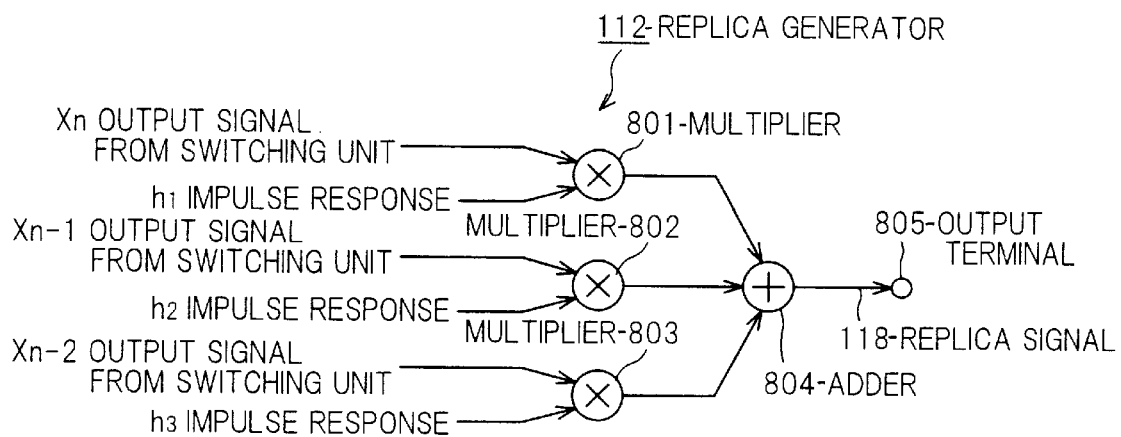
FIG. 7 is a block diagram showing the construction of a replica generator 112 in the phase lock loop circuit shown in FIG. 3.

As shown in FIG. 7, this replica generator 112 comprises multipliers 801–803 and an adder 804. Signals output from the switching unit 111, $x_n$, $x_{n-1}$, $x_{n-2}$, and impulse response ($h_0$, $h_1$, $h_2$) are multiplied respectively in the multipliers 801–803, and the results of the multiplication are added in the adder 804 to perform convolution operation to generate the replica signal 118 of the received signal 117 which is then input through the output terminal 805 into the phase detector 113.

In this case, the received signal 117 is reproduced as the replica signal 118 so far as the estimation and the temporary estimation in the signal estimator 103 are properly carried out. A gentle frequency change, such as frequency offset, can be detected by comparing the replica signal 118 with the actually received signal.

Next, the operation of the phase detector 113 will be explained. In the phase detector 113, the received signal and the replica signal 118 expressed in terms of two-dimensional amplitude value are first converted to amplitude value and phase (r, θ) by checking ROM table using the two-dimensional amplitude values (I, Q) as address. Next, the replica signal 118 thus determined is compared with the phase of the received signal output from the phase rotator 102, and the phase difference is then output.

The output of the phase detector 113 is input into the filter 114. The response of the phase lock loop is determined by the characteristics of the filter 114. FIG. 8 is a block diagram of a typical secondary filter having transmission characteristics represented by the following formula 14.

$$F(z) = \alpha + \beta/(1-z^{-1}) \tag{14}$$

As shown in FIG. 8, the filter 114 comprises multipliers 902, 903, adders 904, 905, and a delay element 906.

The multiplier 902 receives, through an input terminal 901, the signal output from the phase detector 113, and multiplies the signal by coefficient α. The multiplier 903 receives, through an input terminal 901, the signal output from the phase detector 113, and multiplies the signal by coefficient β. The adder 904 adds the output signal of the delay element 906 to the output signal of the multiplier 903. The delay element 906 delays the output signal of the adder 904 by a certain time, followed by the output of the delayed signal. The adder 905 adds the output signal of the multiplier 902 to the output signal of the adder 904, and sends the results of the addition through an output terminal 907 to VCO 115.

In the filter 114, the attenuation coefficient and the inherent frequency of the loop characteristics can be selected by varying the coefficient values α and β.

Figure 9:
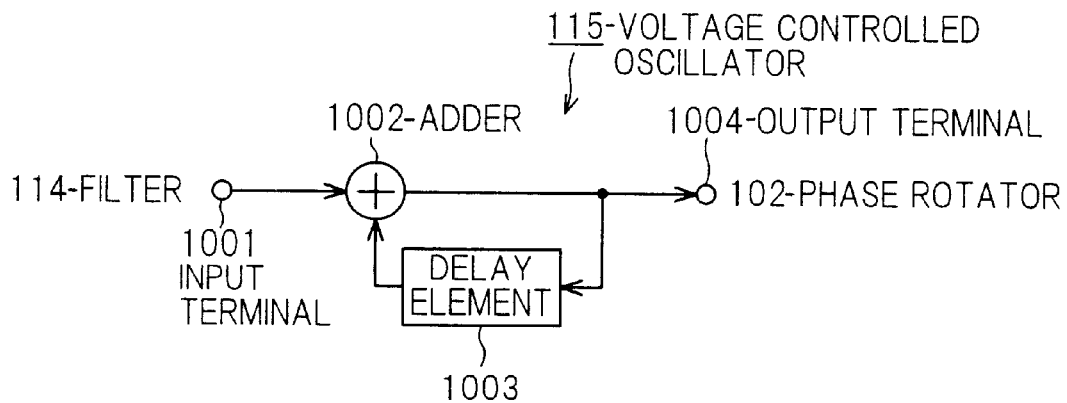
FIG. 9 is a block diagram showing the construction of VCO 115 in the phase lock loop circuit shown in FIG. 3.

VCO 115 may be represented by an integrator as shown in FIG. 9.

As shown in FIG. 9, VCO 115 comprises an adder 1002 and a delay element 1003.

The adder 1002 receives, through an input terminal 1001, a signal output from a filter 114, adds the signal to an output from a delay element 1003, and sends the results through an output terminal 1004 to a phase rotator 102. The delay element 1003 delays the output signal of the adder 1002 by a certain time, followed by the output of the delayed signal.

Figure 10:
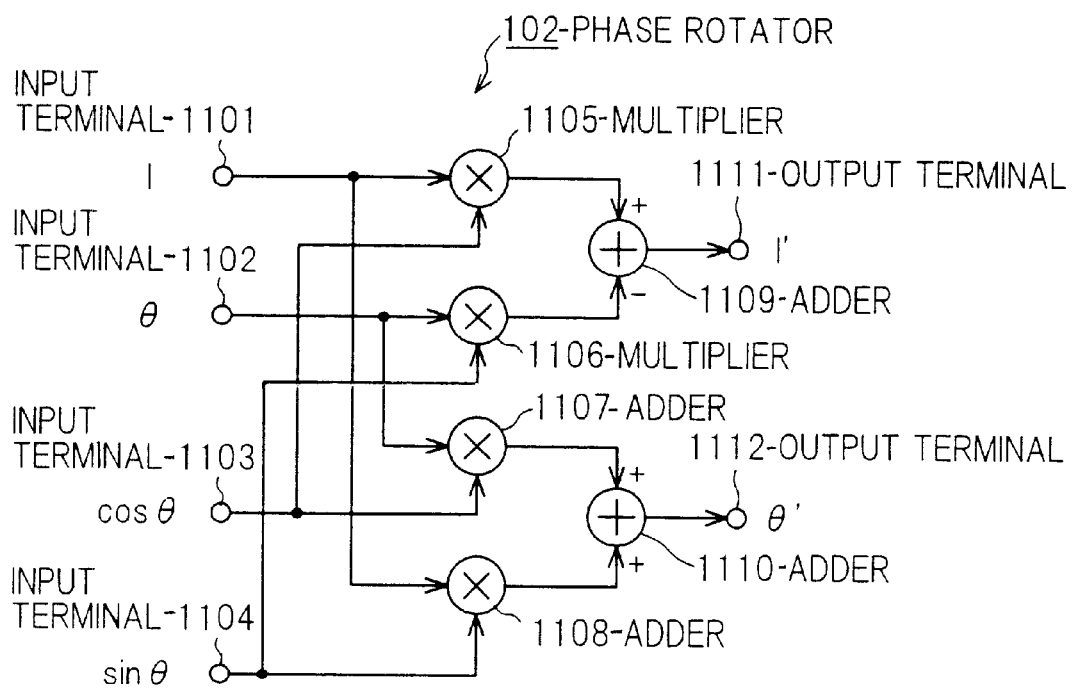
FIG. 10 is a block diagram showing the construction of a phase rotator 102 in the phase lock loop circuit shown in FIG. 3.

The construction of the phase rotator 102 is shown in FIG. 10.

In the phase rotator 102, the output of VCO 115 is first converted to trigonometric functions sin θ, cos θ in ROM table. The phase of the received signal (I, Q) is then rotated by θ by utilizing the addition theorem of trigonometric function shown in the following formulae 15 and 16, and the signal after the rotation (I', Q') is output.

$$I' = I \cos\theta - Q \sin\theta \tag{15}$$

$$Q' = I \cos\theta + Q \sin\theta \tag{16}$$

As shown in FIG. 10, the phase rotator 102 utilizing the addition theorem of trigonometric function comprises multipliers 1105–1108 and adders 1109, 1110. The real part I in the received signal 117 is input into an input terminal 1101, the imaginary part Q is input into an input terminal 1102, the output cos θ in the ROM table is input into an input terminal 1103, and the sin θ is input into an input terminal 1104. Regarding the received signal after the phase rotation (I', Q'), the signal I' is output through an output terminal 1111, and the signal Q' is output through an output terminal 1112.

According to the first preferred embodiment of the invention, in the early stage of the operation of PLL, a path metric history signal 105 is used to generate a replica signal 118, while, when PLL has become stable and causes only a small phase variation, an estimated signal 116 is used to generate the replica signal 118. This can realize such operation that, in a rapid phase variation created in the early stage of the operation of PLL, quick response is done, and, to a slight variation in the stable stage of PLL, response using accurate phase detection is done.

According to the phase lock loop circuit using a signal estimator of the first preferred embodiment of the invention, in digital communication, correction can be made in such a manner that, by means of a receiver using MLSE or DDFSE (delayed decision feedback sequential estimation) for correcting transmission path distortion contained in the received signal, a phase variation, such as a frequency offset, is corrected in quick response at the time of pulling, and more accurately in the stable state.

In the prior art technique, in a receiver using MLSE or DDFSE, a phase variation has been corrected using only the results of decision by MLSE or DDFSE or information on a minimum path metric history. In contrast, according to the first preferred embodiment of the invention, the decision results and the information on the minimum path metric history are properly used in respectively different situations to correct the phase variation. Therefore, according to the situation, more suitable delay time and accuracy of the phase lock loop circuit can be obtained.

As compared with the prior art technique, the effect of quickness and accuracy of the response is particularly significant in the case of large transmission path distortion because, in the large transmission path distortion, the delay time elapsed until the output of the results of decision by MLSE or DDFSE is increased and, in addition, the error of the frequency offset determined in a preamble or the like is increased.

(Second Preferred Embodiment)

The phase lock loop circuit using a signal estimator according to the second preferred embodiment of the invention will be explained.

In the phase lock loop circuit using a signal estimator according to the first preferred embodiment of the invention, for a certain period after the start of the operation of PLL, in order to increase the response speed, a path metric history signal 105 is used to generate a replica signal 118, while, after the convergence of PLL, in order to increase the accuracy, an estimated signal 116 is used to generate the replica signal 118.

In some cases, however, the phase variation to be followed up by the PLL is not stationary, and the phase contained in the received signal 117 undergoes a significant variation also after the convergence of the PLL. According to the second preferred embodiment of the invention, even in such a case, the response of the PLL is properly varied according to the level of the phase variation.

Figure 11:
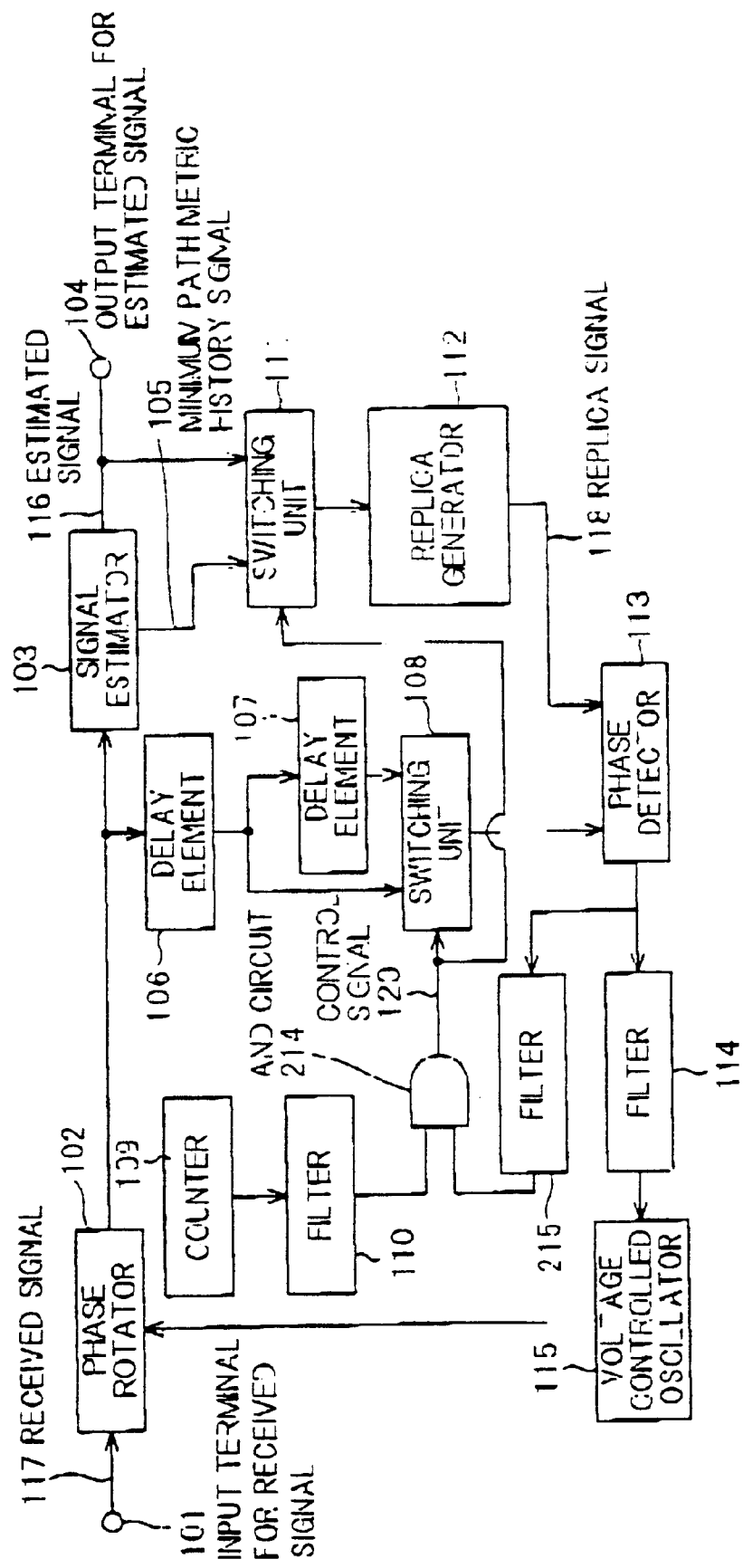
FIG. 11 is a block diagram showing the construction of a phase lock loop circuit using a signal estimator according to the second preferred embodiment of the invention.

The phase lock loop circuit using a signal estimator according to the second preferred embodiment of the invention will be explained with reference to FIG. 11.

The phase lock loop circuit using a signal estimator according to the second preferred embodiment of the invention comprises a phase rotator 102, a signal estimator 103, delay elements 106, 107, switching units 108, 111, a replica generator 112, a phase detector 113, a counter 109, a filter 110, an AND circuit 214, a filter 215, a filter 114, and VCO 115.

The phase lock loop circuit using a signal estimator according to the second preferred embodiment of the invention is different from the phase lock loop circuit using a signal estimator according to the first preferred embodiment of the invention shown in FIG. 3 in that the filter 215 and the AND circuit 214 have been newly added and, further, in the switching units 108, 111, the control of switching is made based on a control signal 120 output from the AND circuit 214.

The AND circuit 214 computes the AND of signals generated in the counter 212 and the filter 213 and signals generated in the phase detector 211 and the filter 215 to generate a control signal 120, followed by the output of the control signal 120.

Figure 12:
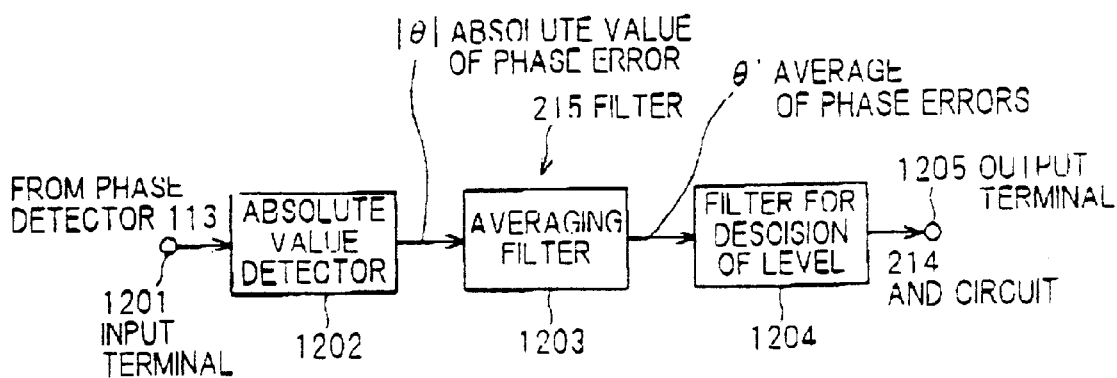
FIG. 12 is a block diagram showing the construction of a filter 215 in the phase lock loop circuit shown in FIG. 11.

The construction of the filter 215 is shown in FIG. 12. The filter 215 comprises an absolute value detector 1202, an averaging filter 1203, and a level decision filter 1204.

Upon the input of a phase error θ detected in the phase detector 113 through an input terminal 1201, the absolute value |θ| is detected in the absolute value detector 1202, and the absolute value |θ| is averaged in the averaging filter 1203. This averages variations in values created by noise and the like.

Figure 13:
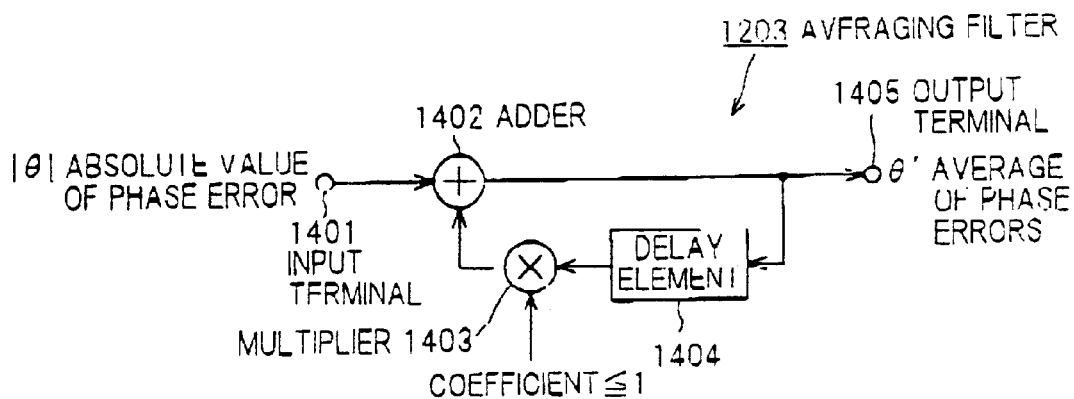
FIG. 13 is a block diagram showing the construction of an averaging filter 1203 in the phase lock loop circuit shown in FIG. 12.
Figure 14:
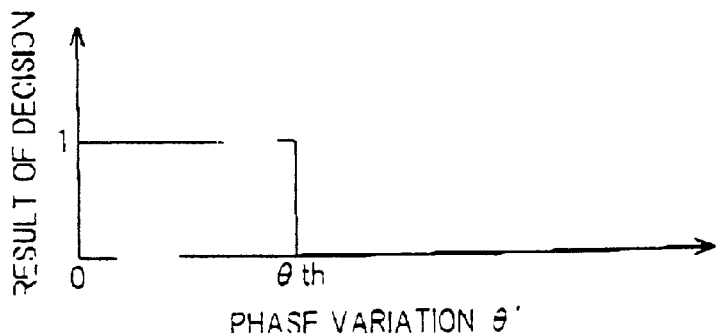
FIG. 14 is a diagram showing the characteristics of a level decision filter 1204.

The construction of the averaging filter 1203 is shown in FIG. 13. The averaging filter 1203 comprises an adder 1402, a multiplier 1403, and a delay element 1404.

The adder 1402 adds the absolute value |θ| received through an input terminal 1401 from the absolute value detector 1202 to the output of the multiplier 1403, and sends the results of the addition through an output terminal 1405 to the level decision filter 1204. The delay element 1404 delays the signal output from the adder 1402 by a certain time, followed by the output of the delayed signal. The multiplier 1403 multiplies the signal output from the delay element 1404 by coefficient γ, followed by the output of the results of multiplication. In this case, γ is a real number of 1 or less.

The average θ' obtained by averaging phase errors θ is input into the level decision filter 1204, and the results of decision on whether or not there is a large phase variation are sent to an output terminal 1205. More specifically, in the level decision filter 1204, the data is passed through a filter as shown in FIG. 12, and, when the average θ' is smaller than a certain value θ, the level decision filter 1204 decides that there is no large phase variation, and, in this case, outputs "1," while, when the average θ' is greater than a certain value θ, the level decision filter 1204 decides that there is a large phase variation, and, in this case, outputs "0."

The AND circuit 214 switches the switching units 208, 209 so that, when both the output of the filter 213 and the output of the filter 215 are "1," the estimated signal 116 is used to detect the phase error, while when both the output of the filter 213 and the output of the filter 215 are "0," the minimum path metric history signal 105 is used to detect the phase error.

Specifically, when the absolute value of the phase error θ detected in the phase detector 113 is smaller than a certain value α after the averaging and, at the same time, a certain time has elapsed after the start of the operation of PLL, the situation is regarded such that PLL has converged and there is no rapid phase variation. In this case, the switching units 208, 209 are controlled so that the estimated signal 116 is used for the detection of the phase error. On the other hand, in the other case, the situation is regarded such that there is a rapid phase variation in the signal input into PLL, followed by control of the switching units 208, 209 so that the minimum path metric history signal 105 is used for the detection of the phase error.

The above operation permits the delay time and accuracy of PLL to be switched according to the status of PLL and the level of the phase variation to be followed up.

As is apparent from the foregoing description, according to the invention, when a high response speed is required, a minimum path metric history signal is used to generate a replica signal, while, in the other case, an estimated signal is used to generate the replica signal. This constitution has the effect of correcting a phase change contained in a received signal in a highly accurate and quick manner.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching herein set forth.

What is claimed is:

1. A phase lock loop circuit using a signal estimator, for detecting and correcting a phase shift contained in a received signal and, in addition, removing transmission path distortion, said phase lock loop comprising:

a signal estimator for estimating a transmission signal series using a Viterbi algorithm from the received signal and outputting the transmission signal series as an estimated signal and, in addition, outputting a minimum path metric history signal obtained as a result of temporary estimation of the signal from the current path status without traceback in the Viterbi algorithm;

switching means which, when a control signal is active, selectively outputs the estimated signal, and, when the control signal is inactive, selectively outputs the minimum path metric history signal;

replica generating means for generating a replica signal using a signal selected by the switching means;

feedback loop means for detecting a phase difference contained in the received signal from the replica signal and the received signal to correct the phase difference; and control signal generating means for rendering the control signal inactive only for a predetermined certain period from the start of the operation of the feedback loop means.

2. The phase lock loop circuit using a signal estimator according to claim 1, wherein the control signal generating means comprises:

a counter for counting the time elapsed from the start of the operation of the feedback loop means;

means which, when the value of the counter is smaller than the predetermined certain value, renders the control signal inactive, and, as soon as the value of the counter becomes not less than the predetermined certain value, renders the control signal active.

3. A phase lock loop circuit using a signal estimator, for detecting and correcting a phase shift contained in a received signal and, in addition, removing transmission path distortion, said phase lock loop comprising:

a signal estimator for estimating a transmission signal series using a Viterbi algorithm from the received signal and outputting the transmission signal series as an estimated signal and, in addition, outputting a minimum path metric history signal obtained as a result of temporary estimation of the signal from the current path status without traceback in the Viterbi algorithm;

switching means which, when a control signal is active, selectively outputs the estimated signal, and, when the control signal is inactive, selectively outputs the minimum path metric history signal;

replica generating means for generating a replica signal using a signal selected by the switching means;

feedback loop means for detecting a phase difference contained in the received signal from the replica signal and the received signal to correct the phase difference; and control signal generating means which renders the control signal inactive when the feedback loop means is in a predetermined certain period from the start of the operation of the feedback loop means or when the phase difference detected in the feedback loop means is not less than a predetermined certain value.

4. The phase lock loop circuit using a signal estimator according to claim 3, wherein the control signal generating means comprises:

a counter for counting the time elapsed from the start of the operation of the feedback loop means;

means for deciding whether or not the value of the counter is not less than the predetermined certain value;

means for deciding whether or not the absolute value of the phase difference between the replica signal and the received signal detected by the feedback means is not less than the predetermined certain value; and logical operation means which, only when the value of the counter is not less than the predetermined certain value and, at the same time, the absolute value of the phase difference is smaller than the predetermined certain value, renders the control signal active, and, in the other case, renders the control signal inactive.

5. The phase lock loop circuit using a signal estimator according to claim 1, wherein the feedback loop means comprises:

a phase detector for detecting the phase difference between the replica signal and the received signal;

a filter for filtering the phase difference detected by the phase detector to output the bandwidth-limited signal;

a voltage-controlled oscillator for generating and outputting a signal of which the frequency is controlled by the signal output from the filter; and a phase rotator for rotating the phase of the received signal based on the signal generated by the voltage-controlled oscillator to correct the phase shift contained in the received signal.

6. The phase lock loop circuit using a signal estimator according to claim 5, further comprising delay time switching means which, when the control signal is inactive, outputs the received signal output from the phase rotator after delay by a time corresponding to the delay time elapsed until, after the input of the received signal output from the phase rotator into the signal estimator, the signal estimator generates a minimum path metric history signal which is then used in the replica generator to generate a replica signal, and, when the control signal is active, outputs the received signal output from the phase rotator after delay by a time corresponding to the delay time elapsed until, after the input of the received signal output from the phase rotator into the signal estimator, the signal estimator generates an estimated signal which is then used in the replica generator to generate a replica signal.

7. The phase lock loop circuit using a signal estimator according to claim 2, wherein the feedback loop means comprises:

a phase detector for detecting the phase difference between the replica signal and the received signal;

a filter for filtering the phase difference detected by the phase detector to output the bandwidth limited signal;

a voltage-controlled oscillator for generating and outputting a signal of which the frequency is controlled by the signal output from the filter; and a phase rotator for rotating the phase of the received signal based on the signal generated by the voltage-controlled oscillator to correct the phase shift contained in the received signal.

8. The phase lock loop circuit using a signal estimator according to claim 3, wherein the feedback loop means comprises:

a phase detector for detecting the phase difference between the replica signal and the received signal;

a filter for filtering the phase difference detected by the phase detector to output the bandwidth limited signal;

a voltage-controlled oscillator for generating and outputting a signal of which the frequency is controlled by the signal output from the filter; and a phase rotator for rotating the phase of the received signal based on the signal generated by the voltage-controlled oscillator to correct the phase shift contained in the received signal.

9. The phase lock loop circuit using a signal estimator according to claim 4, wherein the feedback loop means comprises:

a phase detector for detecting the phase difference between the replica signal and the received signal;

a filter for filtering the phase difference detected by the phase detector to output the bandwidth limited signal;

a voltage-controlled oscillator for generating and outputting a signal of which the frequency is controlled by the signal output from the filter; and a phase rotator for rotating the phase of the received signal based on the signal generated by the voltage-controlled oscillator to correct the phase shift contained in the received signal.

10. The phase lock loop circuit using a signal estimator according to claim 7, further comprising delay time switching means which, when the control signal is inactive, outputs the received signal output from the phase rotator after delay by a time corresponding to the delay time elapsed until, after the input of the received signal output from the phase rotator into the signal estimator, the signal estimator generates a minimum path metric history signal which is then used in the replica generator to generate a replica signal, and, when the control signal is active, outputs the received signal output from the phase rotator after delay by a time corresponding to the delay time elapsed until, after the input of the received signal output from the phase rotator into the signal estimator, the signal estimator generates an estimated signal which is then used in the replica generator to generate a replica signal.

11. The phase lock loop circuit using a signal estimator according to claim 8, further comprising delay time switching means which, when the control signal is inactive, outputs the received signal output from the phase rotator after delay by a time corresponding to the delay time elapsed until, after the input of the received signal output from the phase rotator into the signal estimator, the signal estimator generates a minimum path metric history signal which is then used in the replica generator to generate a replica signal, and, when the control signal is active, outputs the received signal output from the phase rotator after delay by a time corresponding to the delay time elapsed until, after the input of the received signal output from the phase rotator into the signal estimator, the signal estimator generates an estimated signal which is then used in the replica generator to generate a replica signal.

12. The phase lock loop circuit using a signal estimator according to claim 9, further comprising delay time switching means which, when the control signal is inactive, outputs the received signal output from the phase rotator after delay by a time corresponding to the delay time elapsed until, after the input of the received signal output from the phase rotator into the signal estimator, the signal estimator generates a minimum path metric history signal which is then used in the replica generator to generate a replica signal, and, when the control signal is active, outputs the received signal output from the phase rotator after delay by a time corresponding to the delay time elapsed until, after the input of the received signal output from the phase rotator into the signal estimator, the signal estimator generates an estimated signal which is then used in the replica generator to generate a replica signal.

* * * * *